United States Patent [19]

Jensen et al.

[11] 4,371,232
[45] Feb. 1, 1983

[54] GRADED GAP SEMICONDUCTOR OPTICAL DEVICE

[75] Inventors: James D. Jensen, Highland; Richard B. Schoolar, Silver Spring, both of Md.

[73] Assignee: The United States of America as represented by the Secretary of the Navy, Washington, D.C.

[21] Appl. No.: 143,695

[22] Filed: Apr. 25, 1980

Related U.S. Application Data

[62] Division of Ser. No. 864,417, Dec. 27, 1977, Pat. No. 4,227,948.

[51] Int. Cl.³ .................. H01L 27/14; G02B 1/02
[52] U.S. Cl. ..................... 350/1.4; 350/413; 357/30; 357/61
[58] Field of Search ............ 350/1.4, 413; 356/51; 357/61, 30

[56] References Cited

U.S. PATENT DOCUMENTS

| | | |
|---|---|---|
| 3,491,004 | 1/1970 | Van Dijk et al. ............ 357/61 |
| 3,793,070 | 2/1974 | Schoolar ................... 357/61 |
| 3,976,361 | 8/1976 | Fraas et al. ................ 357/30 |
| 4,154,631 | 5/1979 | Schoolar ................... 357/30 |

*Primary Examiner*—Bruce Y. Arnold
*Attorney, Agent, or Firm*—R. S. Sciascia; A. L. Branning; R. E. Bushnell

[57] ABSTRACT

A variable temperature method for the preparation of single and multiple epitaxial layers of single-phase (e.g., face-centered cubic), ternary lead chalcogenide alloys (e.g., lead cadmium sulfide $[Pb_{1-w}Cd_w]_a[S]_{1-a}$ wherein w varies between zero and fifteen hundredths, inclusive, and $a = 0.500 \pm 0.003$), deposited upon substrates of barium fluoride, $BaF_2$, maintained in near thermodynamic equilibrium with concurrently sublimated lead alloy and chalcogenide sources. During preparation, the temperature of the substrate is varied, thereby providing an epilayer with graded composition and predetermined electrical and optical properties along the direction of growth. This growth technique can be used to produce infrared lenses, narrowband detectors, and double heterojunction lasers.

29 Claims, 21 Drawing Figures

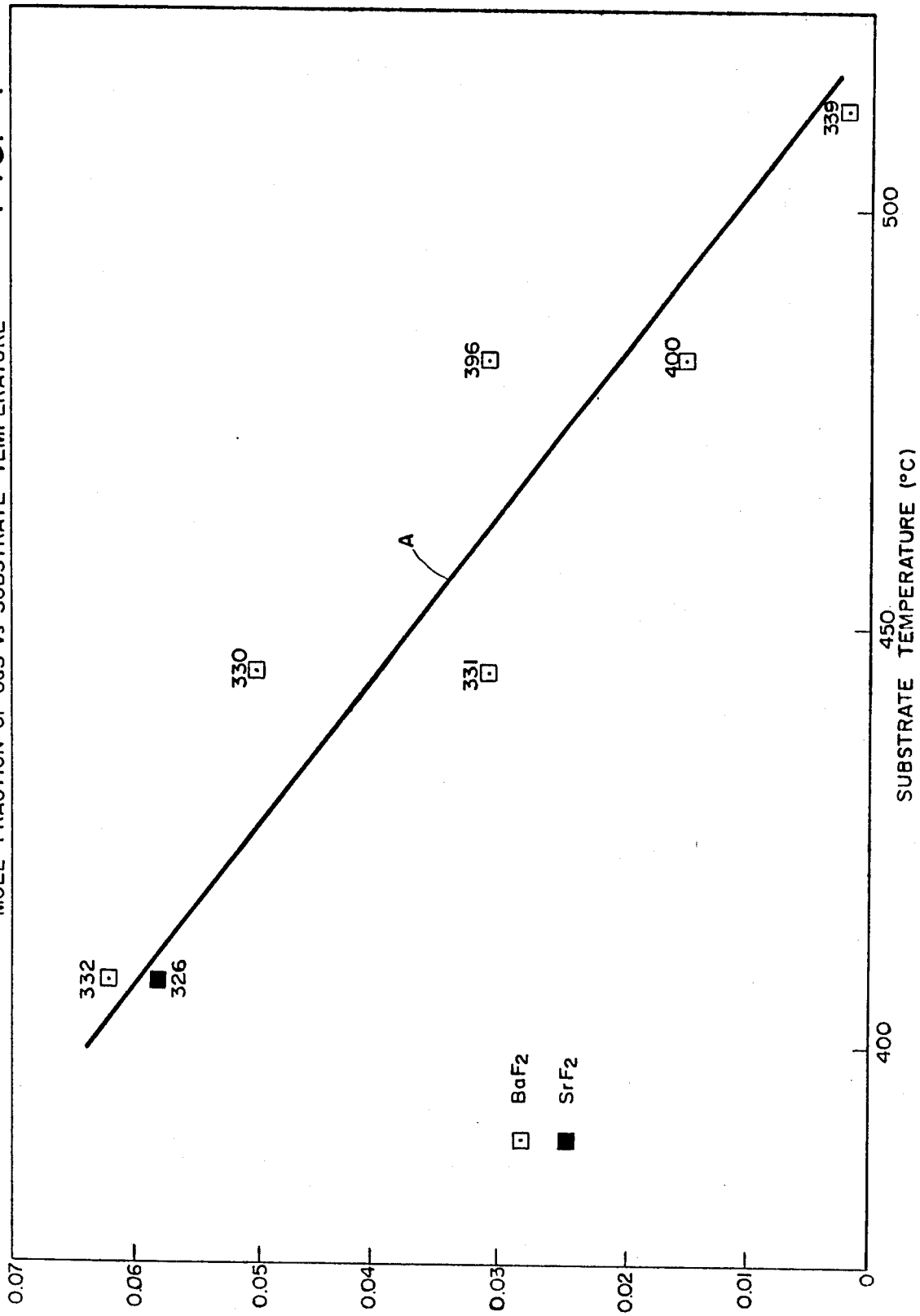

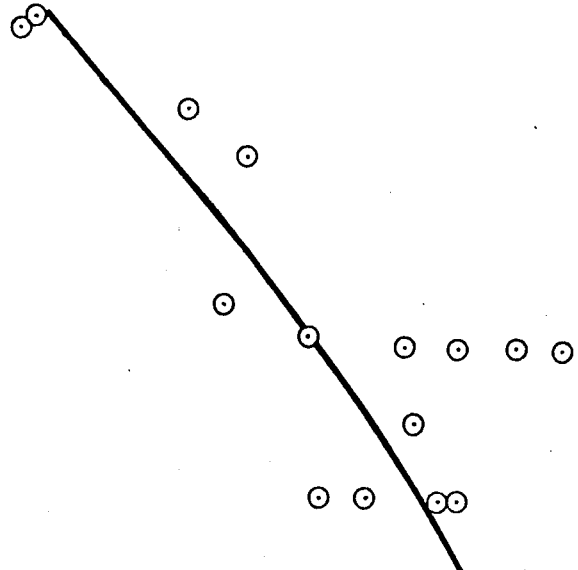
FIG. 5 HALL MOBILITY AT 77K OF P-TYPE $Pb_{1-x}Cd_xS$ vs SUBSTRATE TEMPERATURE

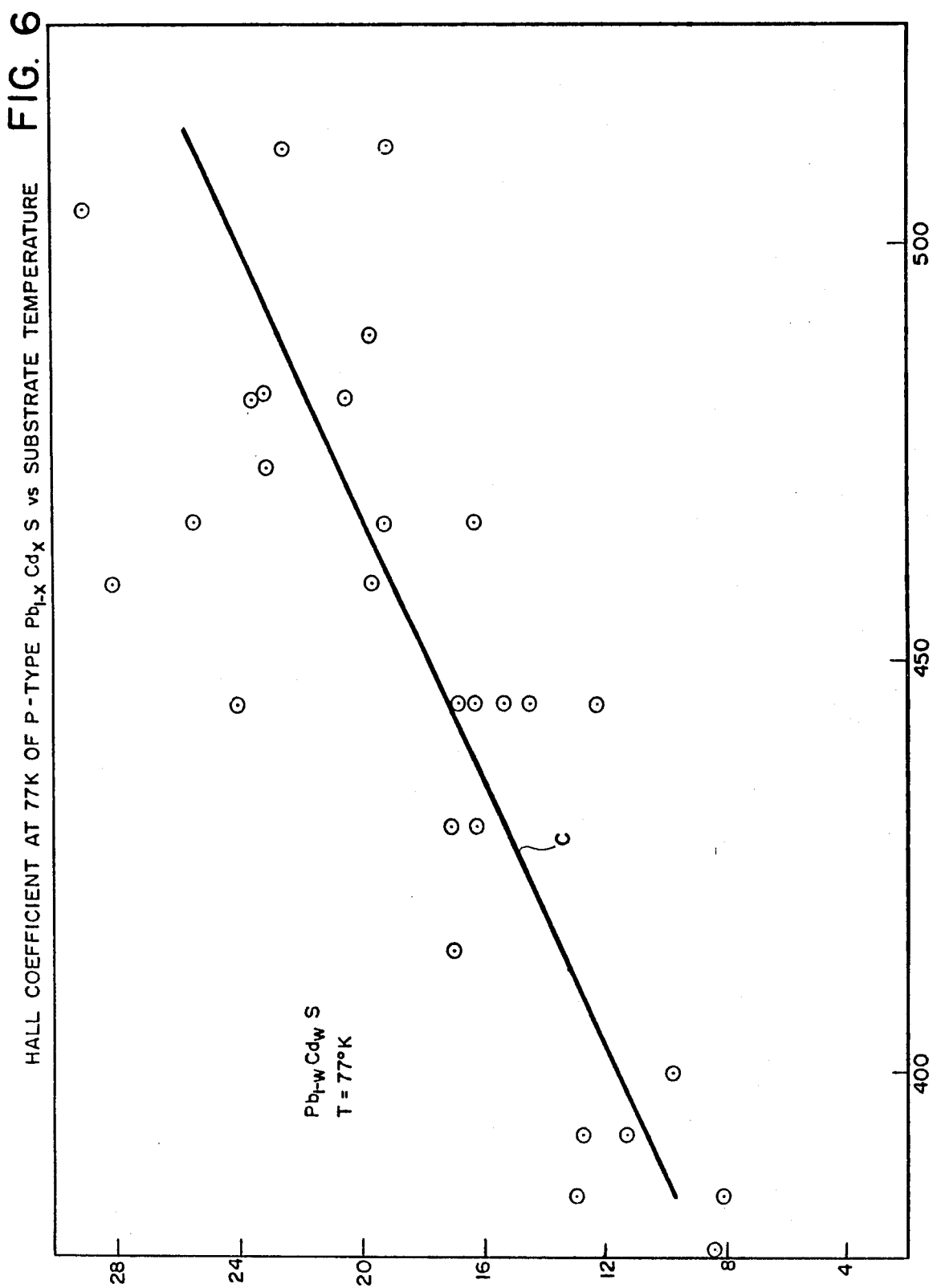

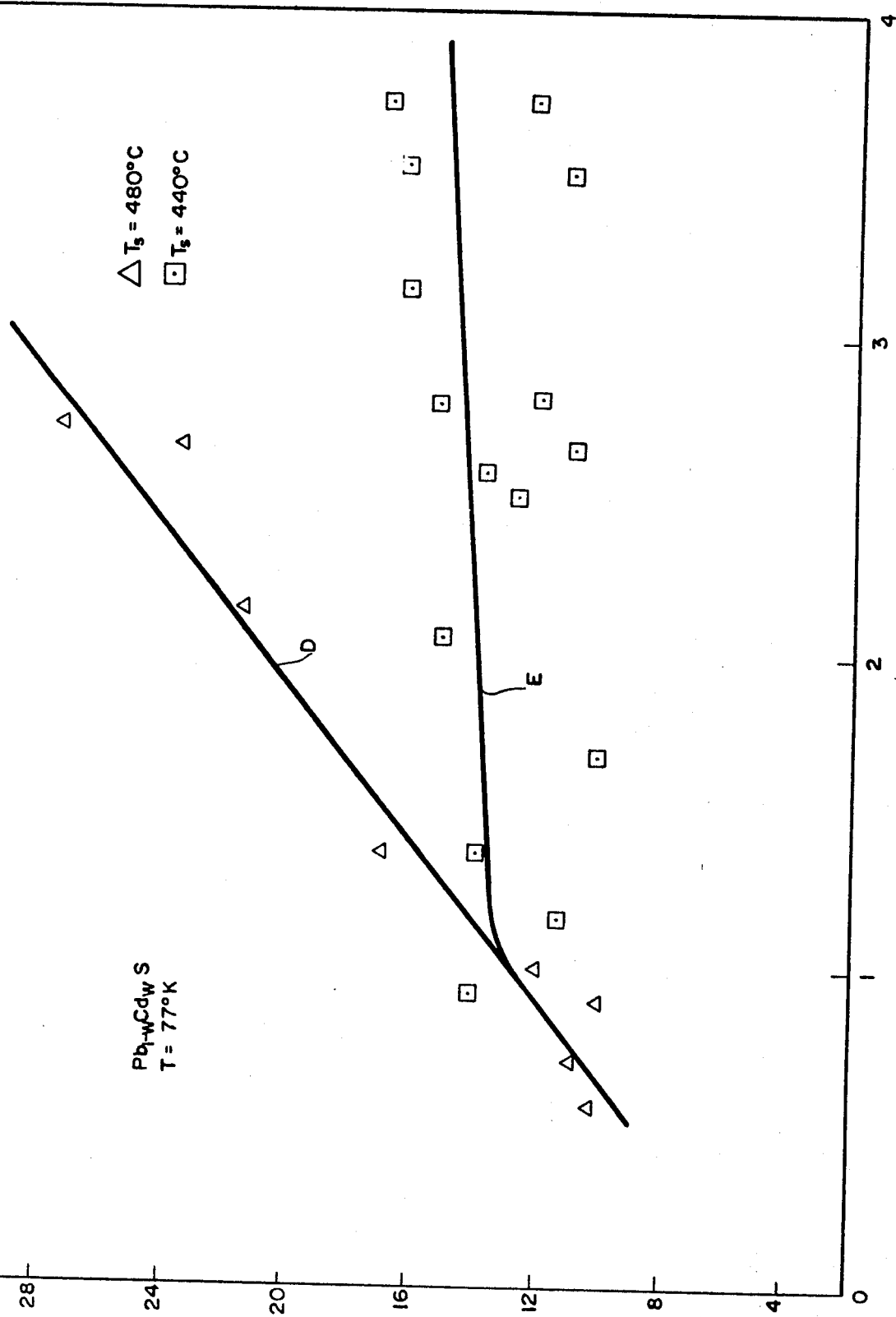

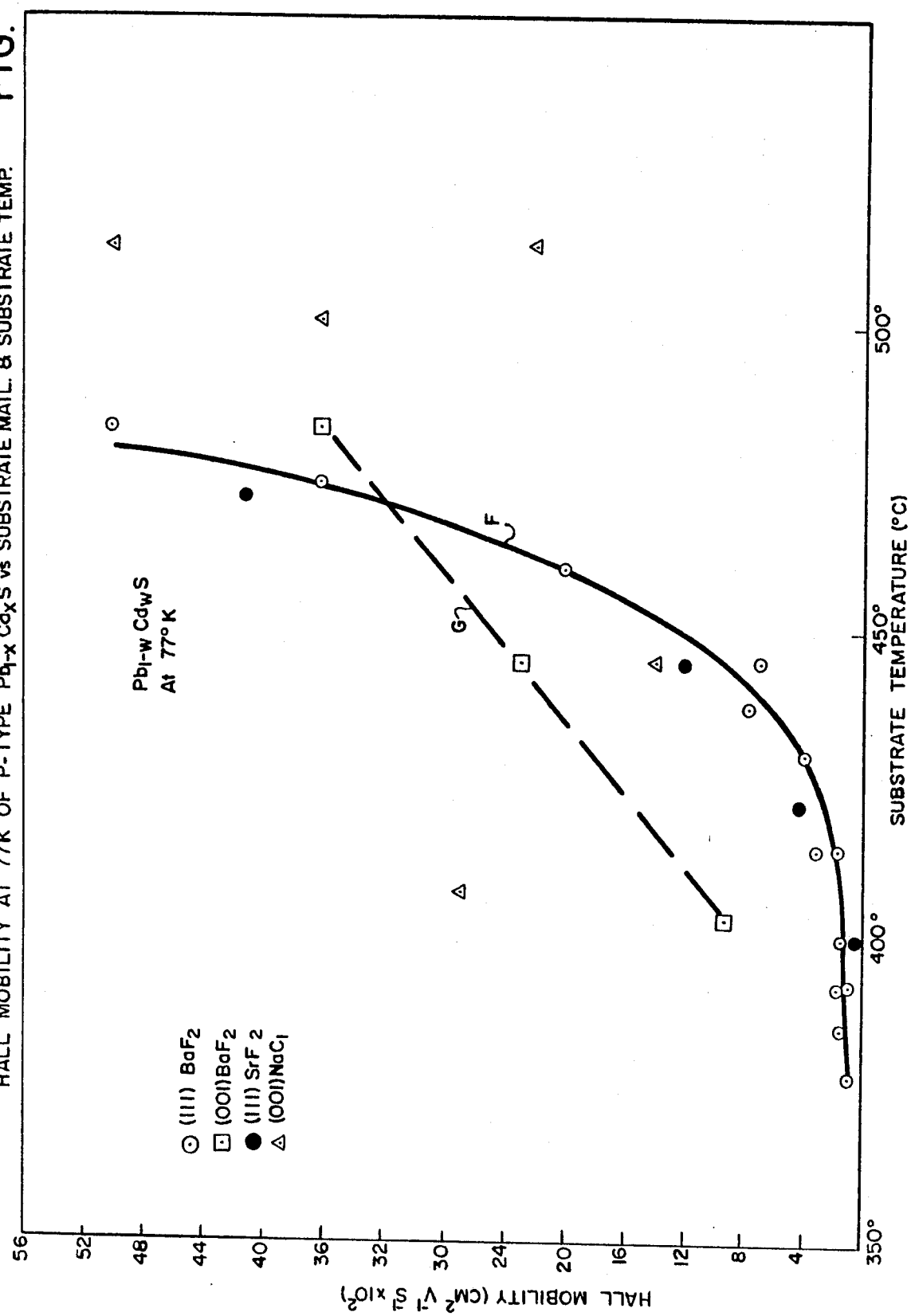

GRADED GAP SEMICONDUCTOR OPTICAL DEVICE

This is a division of application Ser. No. 864,417 filed Dec. 27, 1977 now U.S. Pat. No. 4,227,948.

BACKGROUND OF THE INVENTION

This invention generally relates to a method of preparing epitaxial films for use as infrared detectors, lenses, and light emission devices, and more particularly, to lead chalcogenide epitaxial films suitable for electro-optical applications. Additionally, this invention relates to a simplified method of controlling the composition or energy gap of the semiconductor material during epitaxial growth.

Thin-films of lead salt alloys have been investigated intensively recently with particular attention to their photovoltaic properties. Special attention has been paid to their possible use as detectors of infrared radiation.

The exploration of vacuum deposition techniques is quite recent and, for the benefit of those who may not be familiar with the pioneering efforts in this art, the following brief bibliography is made of record.

Preparation of Single-Crystal Films of PbS, by R. B. Schoolar and J. N. Zemel, Journal of Applied Physics, Vol. 35, No. 6, (June, 1964), pp. 1848 to 1851.

Epitaxial Lead-Containing Photoconductive Materials, by R. B. Schoolar, H. R. Riedl, and J. P. Davis, U.S. Pat. No. 3,574,140, (April 1971).

Method of preparation of Lead Sulfide PN Junction Diodes, by R. B. Schoolar, U.S. Pat. No. 3,716,424, (February 1973).

Method of Varying the Carrier Concentration of Lead-Tin Sulfide Epitaxial Films, by R. B. Schoolar, U.S. Pat. No. 3,793,070, (February 1974).

Photoconductive PbSe Epitaxial Films, by R. B. Schoolar and R. J. Lowney, Journal of Vacuum Science Technology, Vol. 8, No. 1, (1971).

Surface Charge Transport In $PbS_xSe_{1-x}$ And $Pb_{1-y}Sn_ySe$ Epitaxial Films, By J. D. Jensen and R. B. Schoolar, Journal of Vacuum Science Technology, Vol. 13, No. 4, (1976).

More recent efforts, although originating from a different direction, include:

Properties of $PbS_{1-x}Se_x$ Epilayers Deposited Onto PbS Substrates By Hot-Wall Epitaxy, by K. Duh and H. Preier, Journal of Vacuum Science Technology, Vol. 10, pp. 1360, (1975).

PbSe Heteroepitaxy By The Hot-Wall Technique, by K. Duh and H. Preier, Thin Solid Films, Vol. 27, p. 247, (1975).

Double Heterojunction $PbS-PbS_{1-x}Se_x-PbS$ Laser Diodes With CW Operation Up to 96K, by H. Preier, M. Bleicher, W. Riedl, and H. Maier, Applied Physics Letters, Vol. 28, No. 11, (June, 1976).

PbTe and $Pb_{0.8}Sn_{0.2}Te$ Epitaxial Films On Cleaved $BaF_2$ Substrates Prepared By A Modified Hot-Wall Technique, by T. Kasai, D. W. Bassett, and J. Hornung, Journal of Applied Physics, Vol. 47, (July, 1976).

Double-Heterostructure PbS-PbSe-PbS Lasers With CW Operation Up to 120K, by H. Preier, M. Bleicher, W. Riedl, and H. Maier, Journal of Applied Physics, Vol. 47, (December 1976); and, Growth of PbTe Films Under Near-Equilibrium, by A. Lopez-Otero, Journal of Applied Physics, Vol. 48, No. 1, January 1977.

It is well established that single crystal films of PbS, PbSe, and related compounds, hereinafter referred to as lead salt alloys, can be epitaxially grown on heated alkali halide substrates by vacuum evaporation. It is also known that the conductivity type of these semiconductors in bulk form can be controlled by regulating deviation from stoichiometry. Anion (lead) vacancies make these crystals P-type and cation vacancies make them N-type.

In the past, films of the lead salts have been produced through the use of various deposition techniques. These films were homogeneous with constant energy gaps both across their length and throughout their thickness.

SUMMARY OF THE INVENTION

In U.S. Pat. No. 4,154,631 entitled Equilibrium Growth Technique For Preparing $PbS_xSe_{1-x}$ Epilayers, filed on the 27th day of May, 1977, R. B. Schoolar, a co-inventor herein, disclosed a novel process whereby a single-phase lead sulfide selenide, $[Pb]_a[S_xSe_{1-x}]_{1-a}$, epilayer, where x varies between zero and one, inclusive, and $a=0.500\pm0.003$, with predetermined electrical and optical properties is prepared by an equilibrium growth technique (EGT). An alkali-halide substrate maintained in near thermodynamic equilibrium with the source charges is exposed to the single chimney orifice of a two-zone, dual-chamber furnace in which a homogeneous vapor has been produced by concurrent sublimation of a lead alloy in one chamber and a measured amount of chalcogenide in an appendant chamber. Regulation of the composition of the lead alloy charge controls the energy gap and thus the spectral response of the sublimate. Regulation of the ratio between the metal alloy and chalcogenide vapors controls deviations from stoichiometry in the sublimate and thus its conductivity type and carrier concentration. A substitution of materials allows single-phase, epilayers of $Pb_{1-y}Sn_ySe$, $0\leq y\leq 1.0$, to be prepared by this technique. By periodically varying the temperature of the chalcogenide in the appended furnace from below to above its sublimation temperature, multiple planar junction films may be prepared as successive epilayers of the film which will exhibit opposite type conductivities.

The present invention, a modification of the equilibrium growth technique, lies in the step of varying the alloy composition of a lead chalcogenide epilayer during its growth by changing the temperature of the heated substrate. The resulting single-phase epilayer is face-centered cubic with a graded composition through its thickness and, therefore, exhibits a graded energy gap along the same dimension. Incorporation of this step into the equilibrium growth technique permits growth of device quality $Pb_{1-w}Cd_wS$ thin-film epitaxial layers (i.e., "epilayers") where $0\leq w\leq 0.15$, from a single ingot of lead-cadmium sulfide with $w\geq 0.15$.

Accordingly, one object of the invention is to provide a method for epitaxially preparing thin-films of lead-cadmium sulfide.

A second object of the invention is to provide a method for epitaxially preparing thin-films of lead cadmium sulfide having a composition different than that of the source material.

Another object of the invention is to provide a method for epitaxially growing thin-films of ternary lead salt alloys.

Yet another object of the invention is to provide a method for controlling the composition of ternary lead salt alloy films during growth.

Still another object of the invention is to provide a method for epitaxially growing ternary lead salt alloy thin-films with predestined variations in composition across their thicknesses.

Yet another object of the invention is to provide a method for epitaxially growing a ternary lead salt alloy thin-film in which the alloy composition of the film is varied during growth.

A further object of the invention is to provide a ternary lead chalcogenide epitaxial film of quality sufficient for photovoltaic applications.

A yet further object of the invention is to provide a ternary lead salt alloy epitaxial film having a composition tuned spectral response.

A still further object of the invention is to provide a ternary lead chalcogenide thin-film of smooth stoichiometry across its width, suitable for photovoltaic applications.

An additional object of the invention is to provide a ternary lead chalcogenide thin-film of uniform conductivity across its width, suitable for photovoltaic application.

Another object of the invention is to provide a lead-cadmium sulfide photovoltaic detector.

Still another object of the invention is to provide a process for altering the alloy composition of a lead salt thin-film during growth without changing to a second growth apparatus.

BRIEF DESCRIPTION OF THE DRAWINGS

A more complete appreciation of this invention, and many of the attendant advantages thereof, will be readily appreciated as the same becomes better understood by reference to the following detailed description when considered in conjunction with the accompanying drawings in which like numbers indicate the same or similar components, wherein:

FIG. 4 is a graph illustrating the variation in mole fraction of cadmium-sulfide in an epitaxial layer as a function of the substrate temperature during growth.

FIG. 5 is an orthogonal graph illustrating the Hall mobility at 77° K. for twenty-eight $Pb_{1-w}Cd_wS$, films as a function of substrate temperature during growth.

FIG. 6 is an orthogonal graph illustrating the Hall coefficient at 77° K. as a function of substrate temperature during growth of twenty-eight lead-cadmium sulfide samples.

FIG. 7 is an orthogonal graph showing the dependence of the Hall coefficient at 77° K. as a function of thickness in various $Pb_{1-w}Cd_wS$ epilayers with the substrate temperature during growth as a parameter.

FIG. 8 is a graph of Hall mobility versus substrate temperature for several substrate materials.

DETAILED DESCRIPTION

Figure 1:
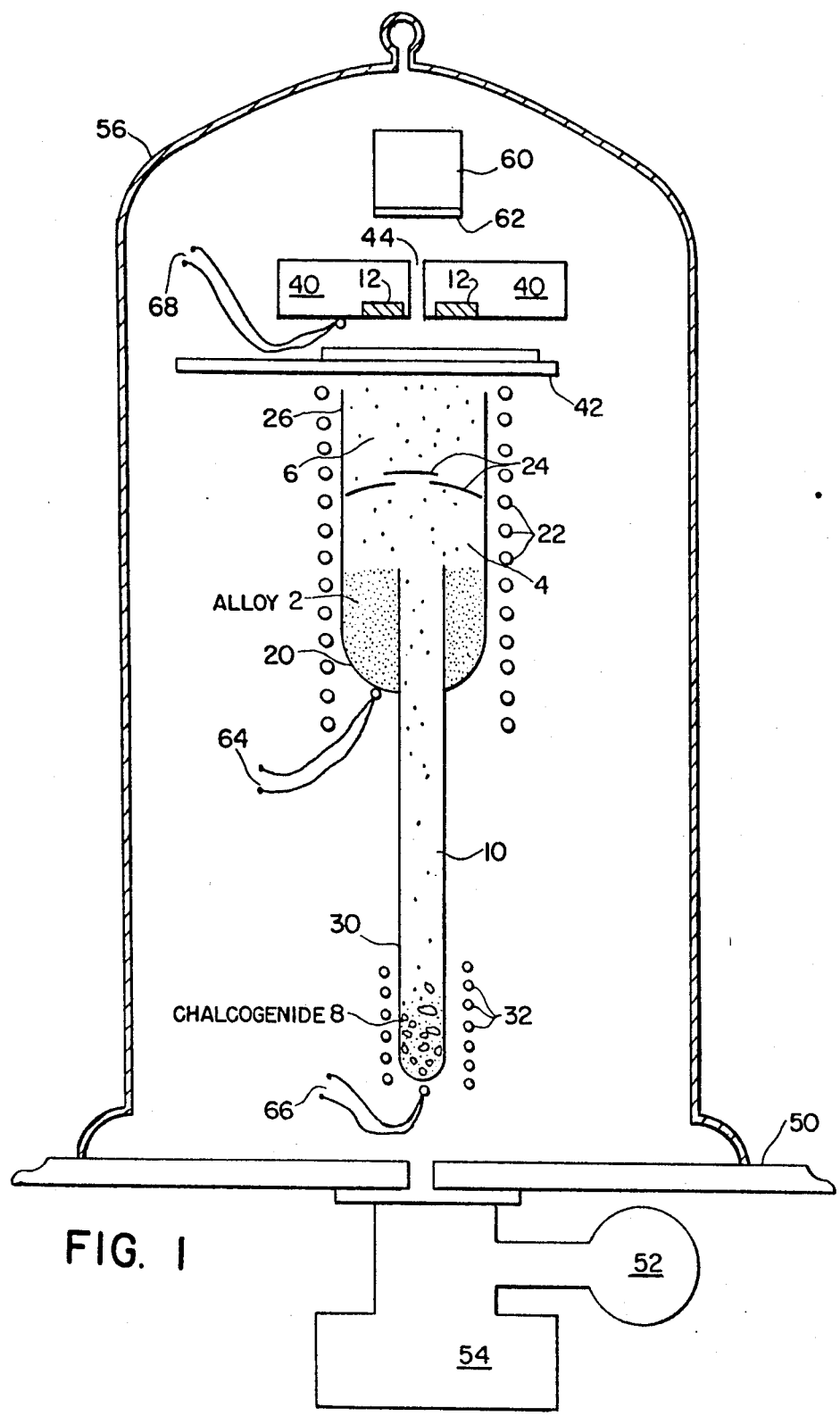
FIG. 1 is a cross-sectional diagram of a sublimation apparatus in which the process of this invention may be practiced.

Referring now to the drawings, and in particular to FIG. 1, there is shown a sectional view of a two-temperature zone vacuum deposition apparatus dedicated to the preparation of device quality epilayers of lead salt alloys by equilibrium growth techniques. The apparatus shown is a conventional glass belljar system with a nitrogen cold trap and oil diffusion pump 54, mounted upon a base 50. The central component of the apparatus illustrated is a two-zone, dual-chamber furnace known colloquially as an "insert." A vertical primary furnace 20, typically fabricated from quartz glass, discharges through its upper extremity into a single orifice chimney 26 of wider diameter. A smaller vertical, secondary furnace 30, also of quartz glass, known as a "cold tip", is formed by a coaxially appended (i.e., co-axially to assure a more uniform distribution of sublimate), blind tube extending through the bottom, and discharging into, above the contents, of primary furnace 20. A simple metal stand (not shown) holds the insert upright. During operation, the contents 2, 8, of primary and secondary furnaces 20, 30 are raised to, and maintained at, a desired temperature by a pair of independently controlled, external thermal devices 22, 32, shown helically coiled around the lower extremities of the primary and secondary furnaces 20, 30. Typically, thermal device 22 is a heater, such as a nichrome wire coupled to a current regulated power supply. Convection and radiant heating occurs between the primary and the upper third of the secondary furnace 20, 30. Depending upon the contents of secondary furnace 30, thermal device 32 may be either a heating coil like thermal coil 22, or a cooling coil. If the chalcogenide charge 8 is sulfur for, example, thermal device 32 may be a short length of pipe or tube placed against base 50 and carrying tap water flowing at a rate sufficient to partially negate convection heating and maintain the sulfur charge 8 at a lower temperature than the metal alloy charge 2 in the primary furnace 20. A glass baffle 24 located between opposite extremities in primary furnace 20 restricts the size of the molecules entering chimney 26.

Placed directly above chimney 26 are one or more substrate heaters 40, each of which raise to, and maintain at, a desired temperature a retensively held substrate layer 12 with one face exposed to the orifice of chimney 26. A commercially available thickness monitor 60 is, space permitting, located above a port 44 in substrate holder 40 so that its replaceable crystal face 62 is exposed to the sublimate passing through port 44. A mask and shutter mechanism 42 located between the orifice of chimney 26 and the exposed faces of substrate layers 12, is normally closed to prevent condensation of the charge materials when the furnaces are not at the proper temperatures. Thermocouples 64, 66, 68 monitor the temperature of source charge 2, chalcogenide 8, and substrates 12, respectively. An ion gauge 52 is used to measure the vacuum inside chamber 56 below $10^{-4}$ Torr. The metal alloy source charge 2 is prepared by mixing weighted masses of research grade component elements of the desired alloys, $[Pb_{1-w}Cd_w]_a[S]_{1-a}$, where $a=0.500\pm0.003$, in proportion to their atomic weight in the composition of the desired epilayer, heating the mixture in an evacuated chamber until it forms an all-reacted melt, and cooling the melt to room temperature. The resulting polycrystal is pulverized into course granules. The atomic fraction, a, is varied within $\pm0.003$ of a stoichiometric mixture to make the mixed mass either slightly metal or chalcogenide rich, as desired. A metal rich mixture, $a>0.500$, will produce an N-type conductivity epilayer in the absence of a compensating chalcogenide dopant 8, while a chalcogenide rich mixture, $a<0.500$, will produce a P-type conductivity epilayer.

Dopant 8 is a six nines (i.e., 99.9999%) pure chalcogenide (e.g., S, Se). The substrates 12 are freshly air-cleaved or polished slices of a single crystal of any orientation such as $BaF_2$, $SrF_2$, NaCl, KBr, or any of the lead salt alloys. The substrates can either be insulating or conducting. The bottom of primary furnace 20 is charged with perhaps twenty grams of the pulverized granules of a metal alloy 2, such as $[Pb_{1-w}Cd_w]_a[S]_{1-a}$, where $0\leq w\leq0.15$. A twenty gram charge 2 is enough to prepare approximately twenty epilayers. The bottom of the cold tip, secondary furnace 30, is charged with perhaps one gram of chalcogenide dopant 8.

Figure 3:
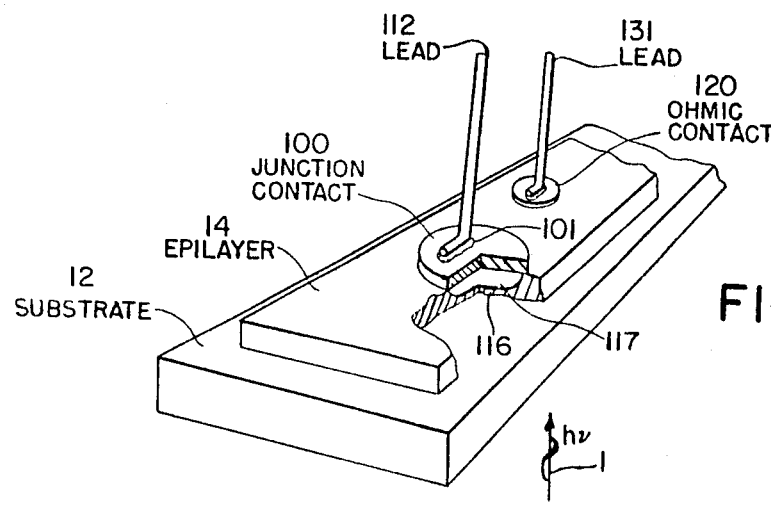
FIG. 3 is an orthogonal projection of a photovoltaic detector prepared according to the equilibrium growth technique.

Prior to operation, prepared crystalline substrates 12 are placed in substrate heater 40. Chamber 56 is evacuated to a pressure on the order of $10^{-6}$ Torr (i.e., approximately $1.3 \cdot 10^{-4}$ Pa), although only a vacuum better than $10^{-5}$ Torr is necessary. The temperature of substrates 12 is raised to and maintained within the 325° to 515° C. range. The stoichiometry "a" of epilayer 14, in FIG. 3, is independent of the substrate temperature. The metal alloy charge 2 in primary furnace 20 is raised to between 550° and 650° C. and is maintained within $\pm5°$ C. of this range. The temperature of dopant charge 8, if the dopant is sulfur, is maintained at room temperature with a tolerance of $\pm5°$ C. Prior to sublimation, a substrate temperature is empirically chosen within this range to allow epitaxial growth. Changing the temperature of either, or both, metal alloy charge 2 or substrate 12 from the lower end of their respective temperature ranges up to approximately 410° C. merely changes the rate of growth of the epilayer film 14 within a range between 2 and 20 microns per hour. The quality of the film is not sensitive to the rate of growth within these ranges. The thickness of the films grown may be varied from approximately one hundred angstroms to well beyond fifty microns.

Figure 2:
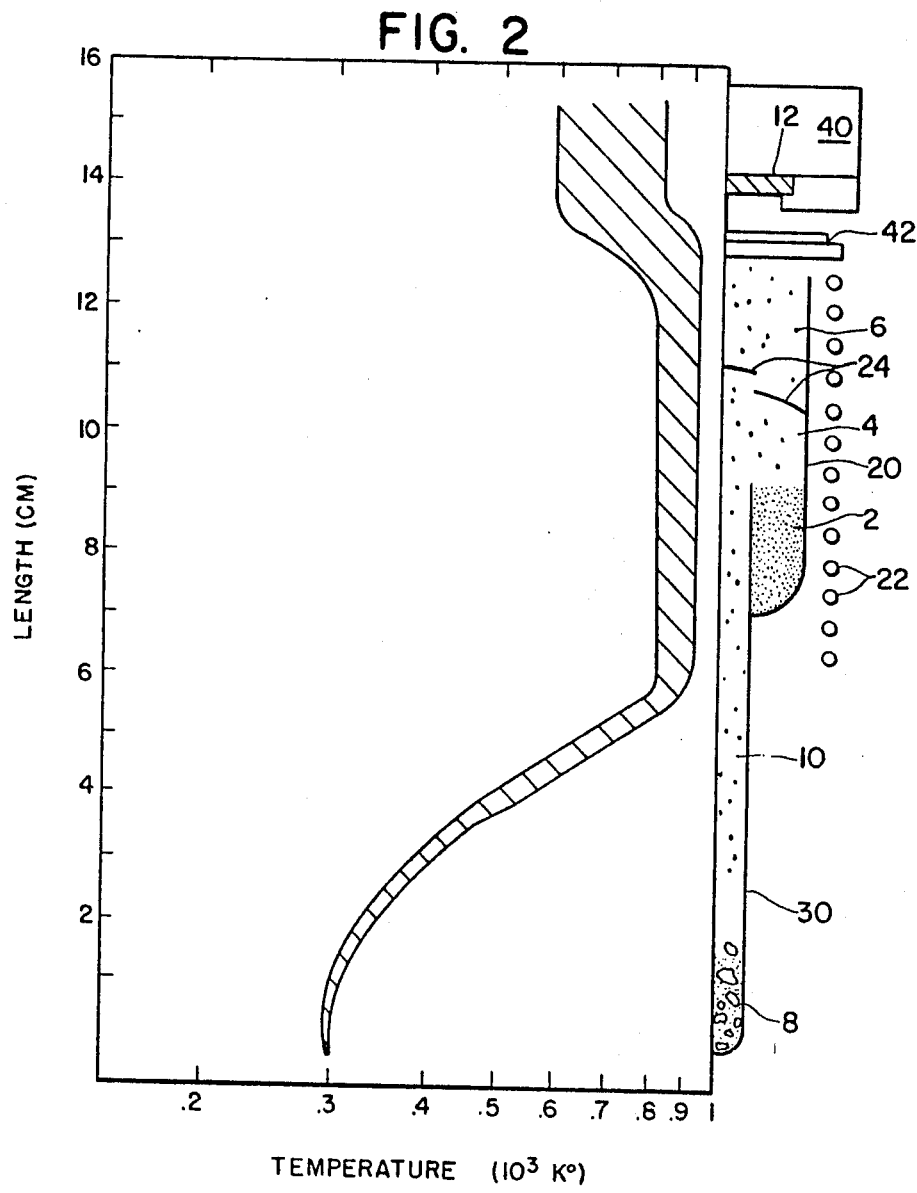
FIG. 2 is a temperature profile range during growth along the length of the apparatus shown in FIG. 1. A logarithmic temperature scale is arrayed along the abscissia.

Turning now to FIG. 2 of the drawings, a vertical operating temperature profile of the two temperature zone apparatus of FIG. 1 is set forth in rectangular coordinates for preparation of a $Pb_{1-w}Cd_wS$ film. A logarithmic temperature scale from approximately room temperature through one thousand degrees Kelvin is arranged along the abscissa, and a half profile of part of the apparatus is arranged along the right ordinate with a linear scale in centimeters along the left ordinate. As shown, the operating temperature inside the apparatus varies from 300° K. (26° C., $\pm5°$), through the sulfur dopant charge 8, to the 770° to 925° K. (500° to 650° C.) range through the metal alloy charge, to the 598° to 790° K. (325° to 515° C.) range at the substrates 12. With chamber 56 evacuated to a gauge pressure below $10^{-6}$ Torr and dopant charge 8 at room temperature, the vapor pressure in the primary furnace is controlled by the vapor-temperature of the sulfur dopant charge, approximately $2\times10^{-4}$ Torr. Thermodynamic equilibrium may be defined (by ignoring the Gibbs function) as a condition in which an isothermal profile exists throughout the length of the growth chamber of the apparatus. The deviation of the profile shown in FIG. 2 from an isothermal assures vapor transport of molecules 6 as well as their condensation upon substrates 12. The necessity of maintaining the temperatures of only two areas of the growth chamber—the main furnace charge 2 and the substrates 12—within specific ranges provides the simplicity of this near equilibrium growth technique and its associated apparatus.

Once the selected operating pressure and temperatures are reached, sublimation of the source charges 2, 8 occurs, shutter mechanism 42 is opened, and those molecular particles 4 and 10 rising past baffle 24 (i.e., molecular particles 6) condense upon the exposed surface of each substrate 12. Baffle 24 is so placed that the larger of particles 4, 10 cannot pass, and that no particle can travel from a source charge 2, 8 to substrate 12 in a straight line. Without baffle 24, large particles would quickly rise through chimney 26, travel to the surface of substrate 12, and either stick and shadow the adjacent surface area, thereby causing pin-holes in the epilayer or hit and richochet from the surface, thereby possibly fracturing epilayer 14. Some particles 6 pass through port 44 and condense upon the crystal face 62 or thickness monitor 60. This condensation decreases the resonant frequency of piezoelectric crystal 62, thereby enabling the amount and rate of growth of the epilayer on nearby substrate 12 to be accurately observed. When an epilayer 14 of the desired thickness is grown, shutter 42 is closed, substrate 40 and furnace 22, and, if used 32, heaters are shut off, and atmospheric pressure is restored to the chamber. After cooling to room temperature, the lead chalcogenide epilayer 14 is exposed to atmosphere and placed into a second evaporator where a Schottky barrier planar junction 116, as shown in FIG. 3, is formed by vacuum depositing on the exposed face of film 14 through a stainless steel mask either a central dot or strip of metal (e.g., indium, bismuth, lead or tin) 100. The as-grown film is vacuum annealed at 170° C. for thirty minutes, and then cooled to room temperature prior to depositing the lead Schottky barriers. This step desorbs oxygen from the air exposed surface and is taken to assure production of a stable device. None of the samples were surface passivated in the following Examples. It should be noted that exposure of the fresh films to atmosphere without passivation causes oxidation of their surfaces with a concomitant reduction in their electrical characteristics. In one experiment, the mask was a narrow array of circular openings with areas of $3.2 \times 10^{-3}$ cm$^2$ on 0.127 cm center spacing. The metal dot 100 inverts the semiconductor and converts part of the underlying volume (i.e, region 117) of epilayer 14 into a region 117 of N-type conductivity. The deposited metal dot 100 serves as an electrical contact on which an electrical lead 112 to an external circuit may be attached with lead solder, or gold or silver paint 101. After depositing the barriers, the epilayers are exposed to atmosphere and inserted into a third vacuum system where a thin metallic layer (e.g., gold or platinum) is deposited elsewhere on the exposed face of epilayer 14 to form an ohmic electrode 120. The gold pad 120 was used for resistivity and Hall coefficient measurements, and served as ohmic contacts for the detector measurements. An ohmic electrode is one that supplies a reservoir of charge carriers that are freely available to enter epilayer 14 as needed. The detector samples were then mounted in an optical dewar with a twenty degree field-of-view and the three Schottky barriers on each film were evaluated. Typically, the impingent radiation 1 passes through substrate 12 and enters epilayer 14. Therefore the material chosen for substrate 12 must be transparent to the wavelengths of interest. BaF$_2$ and SrF$_2$ become opaque at apperoximately 14 microns and KBr at approximately 37 microns. By depositing a very thin (e.g., on the order of 100 Å) layer of metal to form electrical contact 100, the contact will be semi-transparent in the near, intermediate and far infrared bands, and the detector may be displayed to allow impingent radiation 1 to enter epilayer 14 without first passing through substrate 12.

It is apparent that the composition of an epilayer prepared according to the teachings of the foregoing description is dependent upon the composition of the source material. A proposition of this disclosure however, is that the composition of the asgrown epilayer need not be identical to the composition of the source charge. In particular, by varying, rather than maintaining the temperature of the substrate 12 within the stated ranges, the mole fraction of the epilayer may be changed during growth.

The general nature of the invention having been set forth, the following illustrative example is presented as a typical embodiment thereof. It will be understood that the invention is not limited to this example, but is susceptible to various modifications that will be recognized by one of ordinary skill in the arts. The true values of the charge carrier mobilities given in the example are obtained after taking the oxidized surface layer into account by the Petritz two layer analysis, as set forth in "Surface Charge Transport In Pb$S_x$Se$_{1-x}$ And Pb$_{1-y}$Sn$_y$Se Epitaxial Films," by J. D. Jensen and R. B. Schoolar, Journal of Vacuum Science Technology, Vol. 13, No. 4, 1976.

EXAMPLE I

The apparatus shown in FIG. 1 has been used to deposit epitaxial films of Pb$_{1-w}$Cd$_w$S ($0 \leq w \leq 0.15$) on freshly cleaved (111) BaF$_2$. Deposition pressures were on the order of $10^{-6}$ Torr (i.e., $\sim 1.3 \times 10^{-4}$Pa) at the gauge 52 and the substrate temperatures were varied between 400° and 513° C. The main furnace 20 was maintained at 565° C. Growth rates were in the range of two to four microns per hour. The distance between source 2 and substrate 12 was three and one-half centimeters, and the primary furnace 20 was two centimeters in diameter. Approximately twenty grams of granulated, 0.003 metal rich Pb$_{0.94}$Cd$_{0.06}$S source material 2 was placed in the upper furnace 20. This was a charge of material sufficient to obtain fifteen to twenty films of constant composition. The coaxial auxiliary or secondary furnace 30 (used to compensate for the loss of the more volatile element) was charged with a small amount of pure sulfur 8. The sulfur source was used to control the carrier type and concentration of the films when needed. When down to pressure, the substrate heater was turned on and allowed to come to a steady state temperature between 325° C. and the approximate sublimation temperature of the source material, 510° C. The primary oven was then heated to between 565° and 650° C., the shutter opened after thermal equilibrium was obtained, and the films were deposited onto the BaF$_2$ substrates. After growth the films were cooled to room temperature, and removed from the evaporator. Gold pads were then deposited onto the films for transport measurements.

The transport properties at 77° K. of seven films of Pb$_{1-w}$Cd$_w$S grown at different substrate temperatures, T$_s$, with w varying between 0.002 and 0.060 are set forth in Table 1. The variation in composition of seven of the epilayers prepared is shown in the graph of FIG. 4 where the mole fraction, w, of cadmium is plotted as a function of substrate temperature during growth. The epilayers were grown from a single Pb$_{1-w}$Cd$_w$S source charge, w=0.06. By maintaining the substrate temperature at selected values between 515° and 400° C., the mole fraction, w, of cadium-sulfide on successively grown epilayers was varied inversely with substrate temperature between $0 \leq w \leq 0.06$. During growth, the substrate temperatures were maintained within ±5° C. of the temperatures indicated.

The foregoing detailed discussion describes a growth technique for preparing device quality, single-phase, lead-cadmium sulfide epilayers of controlled composition and energy gap. The technique allows the energy gap of the epilayer to be varied uniformly with thickness by changing the temperature of the substrate during growth thereby providing a process for preparing composition tuned detectors within the spectral region from two to four microns. Similarly, by varying the composition of other lead chalcogenide alloy charges, this process allows preparation of composition tuned detectors from the near to the far-infrared regions. In addition, the minority charge carrier lifetimes of epilayers prepared under the teachings of the present process are lengthened and the number of crystal defects reduced, by

TABLE I

PROPERTIES OF Pb$_{1-w}$Cd$_w$S FILMS

| SAMPLE | THICKNESS μm | N $10^{17}$cm$^{-3}$ | $\mu_H$ cm$^2$V$^{-1}$s$^{-1}$ | $E_g$ eV | w | $T_s$ °C |
|---|---|---|---|---|---|---|
| 326 | 1.83 | 1.7 | 340 | 0.504 | 0.058 | 408 |
| 330 | 1.53 | 2.1 | 420 | 0.477 | 0.050 | 440 |
| 331 | 1.72 | 3.0 | 820 | 0.407 | 0.029 | 440 |
| 332 | 3.20 | 5.2 | 160 | 0.517 | 0.060 | 408 |
| 359 | 2.35 | 2.8 | 8800 | 0.318 | 0.002 | 513 |
| 396 | 0.90 | 6.3 | 2200 | 0.413 | 0.031 | 483 |
| 400 | 2.72 | 2.3 | 3000 | 0.370 | 0.015 | 483 | maintaining an elevated substrate temperature during growth, thereby allowing for room temperature operation of the detectors prepared from the epilayers.

Hall mobility measurements made at 77° K. are plotted in FIG. 5 as a function of the substrate temperature during growth for a series of P-type lead-cadmium sulfide epilayers. The mobilities are very low for samples grown upon substrates maintained at less than 400° C. during deposition. The maximum hole mobility at 77 K. is 8,800 cm$^2$V$^{-1}$sec$^{-1}$, and occurs in an epilayer grown upon a substrate maintained at 513° C. Mobility degraded in epilayers grown upon substrates maintained at temperatures greater than 513° C. due to thermal etching of the sample and substrate. The Hall coefficients at 77° K. are plotted in the graph of FIG. 6 as a function of substrate temperature during growth for the same P-type lead-cadmium sulfide epilayers. Those epilayers grown upon the hotter substrates tended to have lower hole concentrations. It should be noted that some of the scatter in the data is due to variations in the epilayer thickness. This dependence is shown by the graph of FIG. 7 where the Hall coefficient at 77° K. is plotted as a function of sample thickness for two growth temperatures. One set, indicated by the square data points representing epilayers grown upon substrates maintained at 440° C., shows slight thickness dependence. The other set, indicated by triangular data points representing epilayers grown upon substrates maintained at 480° C., clearly shows the dependence. Samples grown upon substrates maintained at lower temperatures (i.e., less than 350° C.) show no dependence by the Hall coefficient upon epilayer thickness.

Diverse modifications to the process disclosed in the foregoing teachings are possible. For example, by changing the temperature of the substrate within the range between 350° C. and the sublimation temperature of the alloy source, the cadmium mole fraction of the subsequent film growth will differ from that of the preceding layer. As the adjoining layers differ in composition, they will exhibit peak responsivities at different wave lengths. Periodic variation of the substrate temperature will provide an epilayer with adjoining, distinct layers of different composition. Typically, the source alloy is described in these teachings as lead-cadmium sulfide. Without deviating from the principles of the process, either lead-cadmium selenide or lead-cadmium telluride may be used as a source alloy.

In a further modification, selenium could be substituted for the sulfur dopant charge. Since selenium has a much lower vapor pressure, the "cold tip" 30 would have to be heated to approximately 130° C. to obtain single-phase films. Higher tip temperatures would produce P-type films and lower tip temperatures would yield N-type layers. Similarly, tellurium could be used as a dopant charge. Furthermore, this technique provides a method to prepare either single or multiple planar junction devices. By periodically varying the temperature of the chalcogenide contents in cold tip 8 from below to, or above, its sublimation temperature, the partial pressure of the chalcogenide vapor in uniformly mixed molecular particles 6 will increase, resulting in a change in the conductivity of the subsequent thickness of the film. If alloy charge 2 is slightly metal rich, and during the initial growth of epilayer 14 the temperature of the chalcogenide 8 in cold tip 30 is kept below the sublimation temperature of the chalcogenide, the first growth will exhibit a N-type conductivity. If the temperature of chalcogenide is raised to, or above, the sublimation temperature of chalcogenide, the subsequent growth of epilayer 14 will exhibit a P-type conductivity. Returning the temperature of chalcogenide 8 to below its sublimation temperature will cause the next growth to exhibit N-type conductivity. As the process assures a uniform mixture of the vapors from metal alloy 2 and chalcogenide 8, and thus growth of uniform stoichiometry, successive layers will clearly define a planar P-N junction.

Figure 8A:
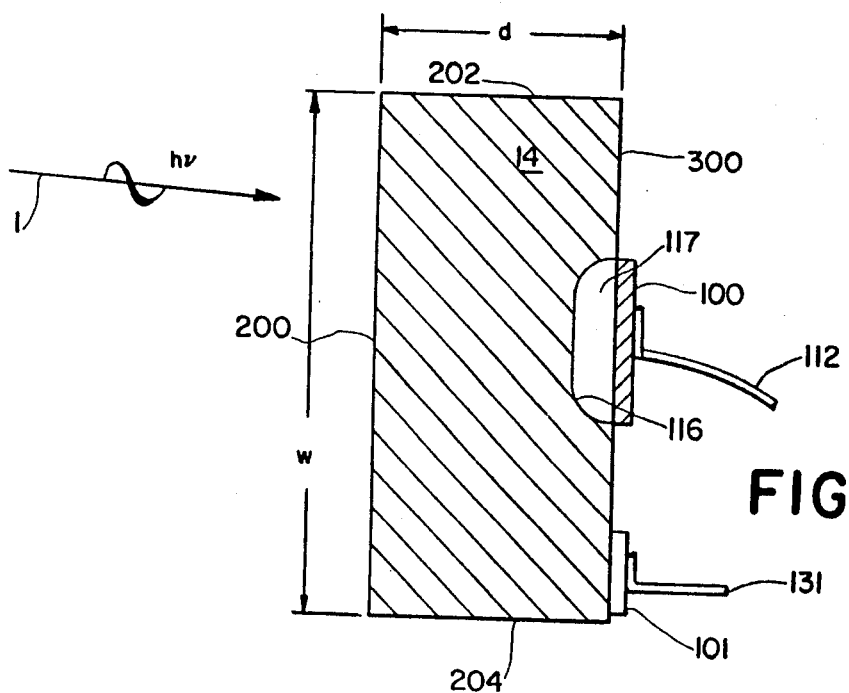
FIG. 8A is a cross-sectional view of a single layer narrowband detector.

The simplicity of the graded-gap growth technique disclosed in the foregoing paragraphs facilitates preparation of numerous semiconductor devices. Refer now to FIG. 8 where a cross-sectional view illustrates the structure of a back-illuminated, narrowband detector prepared according to the teachings of the present invention by growing a single layer 14 of a P-type semiconducting material upon a transparent, insulting substrate 12 (not shown in FIG. 8). Typically, surface 200 adjoins the substrate 12. A shallow P-N junction 117 is formed by evaporation of a lead contact 100 upon surface 300. The lead completely inverts the semiconductor epilayer 14 beneath contact 100 to N-type conductivity. Ohmic contact 101 is created by evaporation of a gold or platinum contact onto part of the remaining surface 300 of epilayer 14. All of these processes are completed in a vacuum of at least 10$^{-6}$ Torr at the gauge.

As is more fully taught in the copending application of R. B. Schoolar for U.S. Letters Patent, entitled Narrowband Infrared Detector, assigned Ser. No. 833,798 filed in the Patent Office on the 16th of September, 1977, (now abandoned), the energy gap, $E_F$, of the region of layer 14 exposed to incident radiation 1 (i.e., the "filter" region) must equal or exceed the energy gap, $E_D$, of the region on the opposite side of the layer from the exposed region (i.e., the "detector" region):

$$E_F \geq E_D. \qquad (1)$$

Figure 9A:
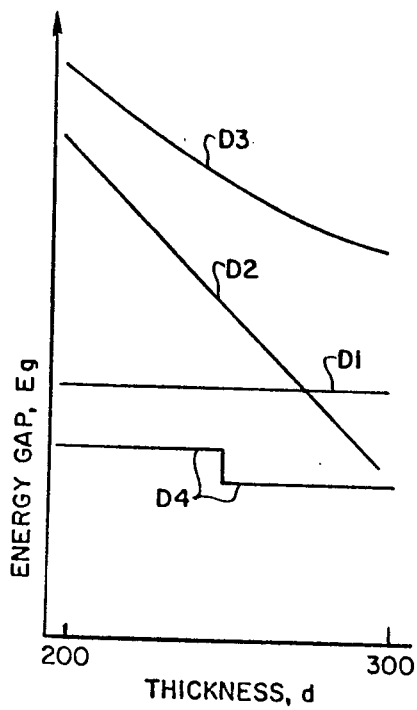
FIG. 9A is an orthogonal graph illustrating the change in the energy gap as a function of the thickness of the film for three devices prepared according to the present invention.
Figure 9B:
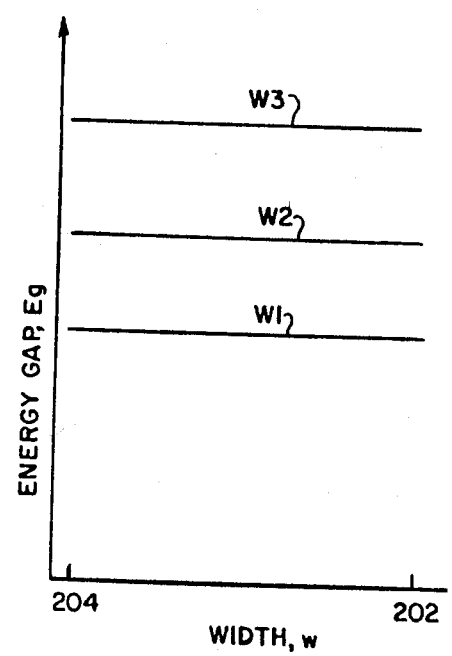
FIG. 9B is an orthogonal graph illustrating the change in the energy gap as a function of the width of the film for the three embodiments represented by the curves of FIG. 9A.

FIG. 9A shows three curves representing three epilayers in which the variation in the energy gap of layer 14 as a function of its thickness, d is an ordered continuum. Curve D1 represents a narrowband detector in which $E_F$ equals $E_D$, a relation obtained by maintaining the temperature of the substrate constant during growth of layer 14. Curves D2 and D3 represent narrowband detectors in which the energy gaps across the filter regions exceeds the energy gap across the detector regions, a relation obtained by varying the temperature of the substrate during growth either linearly or nonlinearly respectively, with respect to the rate of growth. As indicated by the three curves of FIG. 9B (curves W1, W2, and W3 correspond to the devices represented by curves D1, D2, and D3, respectively), the energy gap across any plane parallel to surfaces 200, 300 (i.e., the "width-of-growth" of layer 14) is constant.

It is quite easy, using the graded-gap technique, to prepare a narrowband detector having adjoining filter and detector regions, each with constant compositions (and thus, energy gaps) across their thicknesses, but with the two energy gaps changing abruptly at the junction between the two regions. During preparation of such a device, after growth of a filter region having the desired thickness, the growth is interrupted by closing the shutter mechanism 42, the temperature of substrate 12 is raised, and after the reoccurrence of equilibrium conditions, shutter mechanism 42 is reopened. The step function curve D4 in FIG. 9A is an example of the energy gap profile across the thickness of a narrowband detector prepared in this manner.

Figure 10:
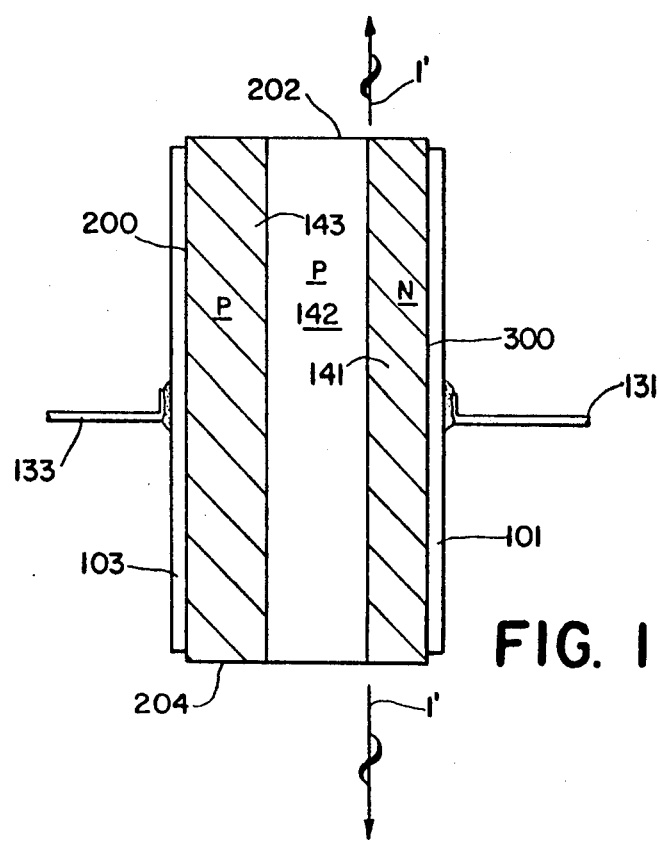
FIG. 10 is a cross-sectional view of a heterojunction laser prepared according to the present invention.
Figure 11A:
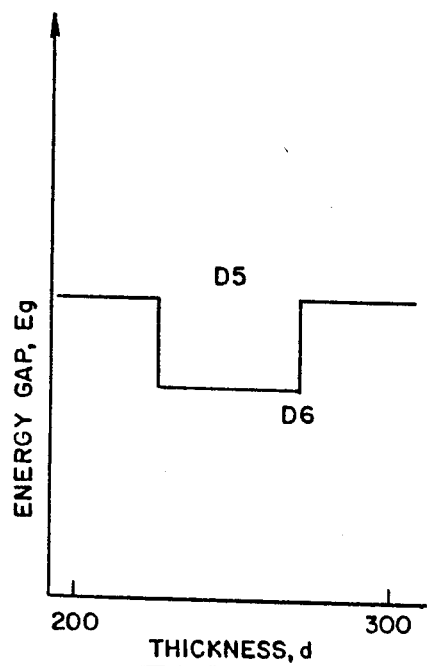
FIG. 11A is an orthogonal graph illustrating the variation in the energy gap as a function of thickness of adjoining layers of the film shown in FIG. 10.
Figure 11B:
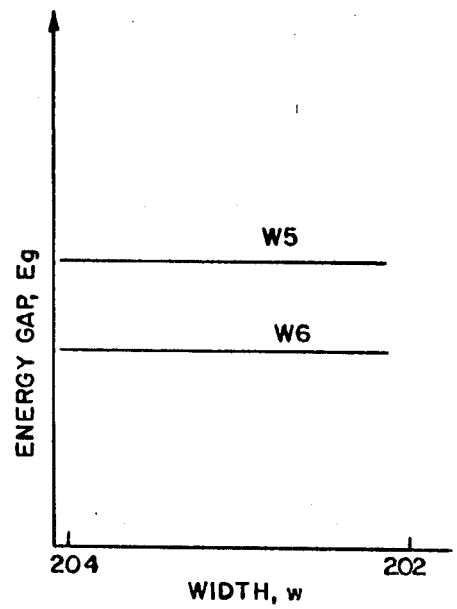
FIG. 11B is an orthogonal graph illustrating the variation in the energy gap as a function of width of layers of the film shown in FIG. 10.

FIG. 10 shows a side view of a heterojunction laser prepared according to the teachings of the presently disclosed process as a three layer, graded-gap device continuously grown upon a substrate (not shown) adjacent to either layer 141 or 143. As is shown by curves of FIG. 11A, the energy gap varies abruptly between surfaces 200, 300. The outer regions 141, 143 have substantially constant energy gaps, as is indicated by curves D6, each of which are higher than that of the interior region 142 of the layer 14. By closing the shutter mechanism 42 and increasing the temperature of substrate 12 (not shown in FIG. 10) during the growth process, and then reopening shutter 42 after the reoccurrance of equilibrium conditons, the composition, but not the type of conductivity, of the subsequently grown thickness of the layer is abruptly altered, producing a region 142 having a lower energy gap, as is indicated by curve D6, than that of the previously grown region 141. After region 142 obtains the desired thickness, again closing shutter 42, decreasing the temperature of substrate 12, and then reopening shutter 42 after reoccurrence of equilibrium conditions will provide a subsequently grown third region 143 having a composition, and thus an energy gap, abruptly differing from that of the previously grown region 142, as is indicated by curve D5. FIG. 11B shows that the energy gaps of region 142, as indicated by curve W6, and regions 141, 143, as indicated by curve W5, are substantially constant across the width-of-growth (i.e., between surfaces 202 and 204). The abrupt changes in the levels of the energy gaps D5, D6 at the junctions between regions 141, 142 and 142, 143 distinctly define the active region 142 and the two junctions. To function as a hererojunction laser, one of the two outer regions 141, 143 must differ in stoichiometry, composition and type of conductivity from the active region 142. If regions 143, 142 are grown with a P-type conductivity, then region 141 must be grown with an N-type conductivity. Electrical conductors 101, 103 are placed on any portion of the outer surfaces 300, 200 respectively, of regions 141, 143. Application of a signal to terminals 131, 133 causes an injection current to flow through the entire layer 14, resulting in laser action supported by the forward biased of the P-N junction 141-142. The surfaces formed by 141-142 and the opposite junction, 142-143, act as optically confining surfaces. Since there is a gain in the plane of the forward biased junction, the device will emit a laser beam 1' along the plane between naturally reflective surfaces 202 and 204. A primary advantage of the double layer heterojunction laser is its high efficiency. The advantage of our device lies in the simplicity of its production. The laser is grown continuously without breaking vacuum. The junctions are therefore not exposed to air during growth.

Figure 12A:
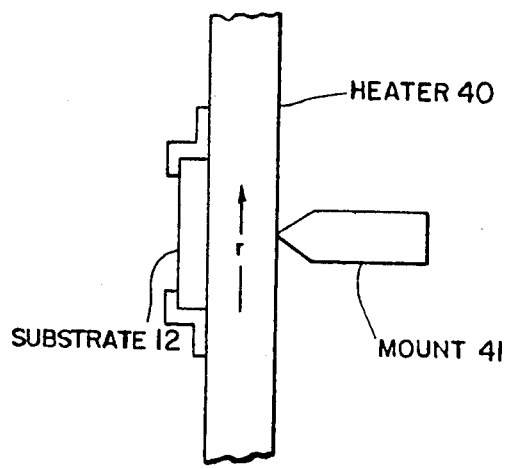
FIG. 12A is a side view of a point contact substrate heater.
Figure 12B:
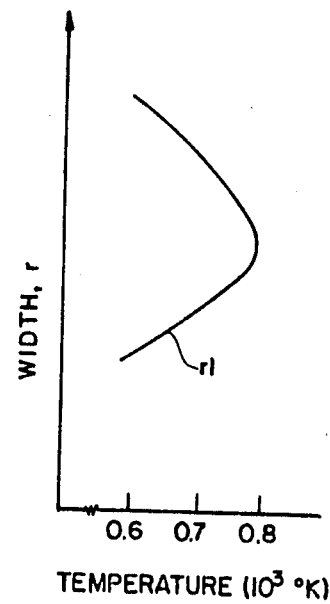
FIG. 12B is an orthogonal graph illustrating the variation in substrate temperature produced with the heater shown in FIG. 12A, in units of one thousand degrees Kelvin, as a function of substrate width.

The details of the preceding paragraphs describe the instant process as one for preparing semiconductors having an energy gap graded across the direction of growth (i.e., the "thickness of growth"). In this process, the semiconductor is grown upon a substrate that typically, at any given instant, is uniformily maintained at a selected temperature. The energy gap of the semiconductor may be either smoothly or abruptly graded across its thickness by either gradually varying the substate temperture or by closing the shutter mechanism to interrupt the growth process, changing the substrate temperature, and then, upon reoccurrence of near (as determined by monitoring the thermocouples 64, 66, 68) equilibrium conditions, reopening the shutter. A modification of this process allows preparation of a semiconductor having an energy gap graded along the plane normal to the direction of growth (i.e., along its "width-of-growth"). The modification requires maintenance of a temperature profile along the exposed face of the substrate during growth of the semiconductor. FIG. 12A is a side view of a substrate 12 indirectly heated by a point contact heater element 40 (i.e., a heat "source"). A metal mounting plate 41 (i.e., a heat "drain") separates the face opposite the exposed face of substrate 12 from, and distributes the heat of, heating element 40. Consequently, the exposed face of substrate 12 exhibits a parabolic temperature profile. FIG. 12B shows such a temperature profile with curve r1.

Figure 13A:
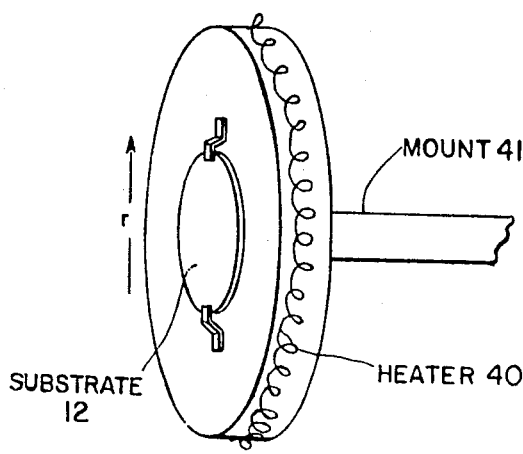
FIG. 13A is an oblique view of a circumferential substrate heater.
Figure 13B:
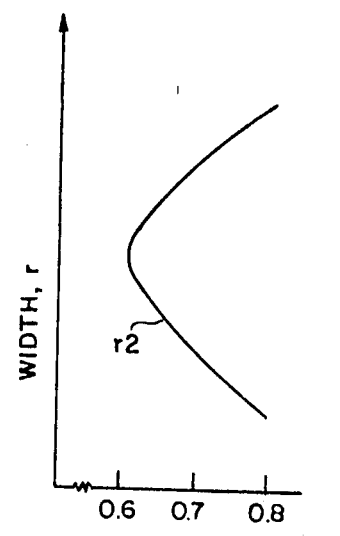
FIG. 13B is an orthogonal graph illustrating the variation in substrate temperature produced with the heater shown in FIG. 13A, in units of one thousand degrees Kelvin, as a function of substrate width.

FIG. 13A is an oblique view of a substrate 12, cleaved in the shape of a wafer, indirectly heated by a spiral nichrome heater element 40'. A metal mounting plate 41' (i.e., a heat "drain") separates the face opposite the exposed face of substrate 12 from, and distributes the heat supplied by, heater element 40'. Curve r2 in FIG. 13B shows the temperature profile of substrate 12 along its face.

Figure 14:
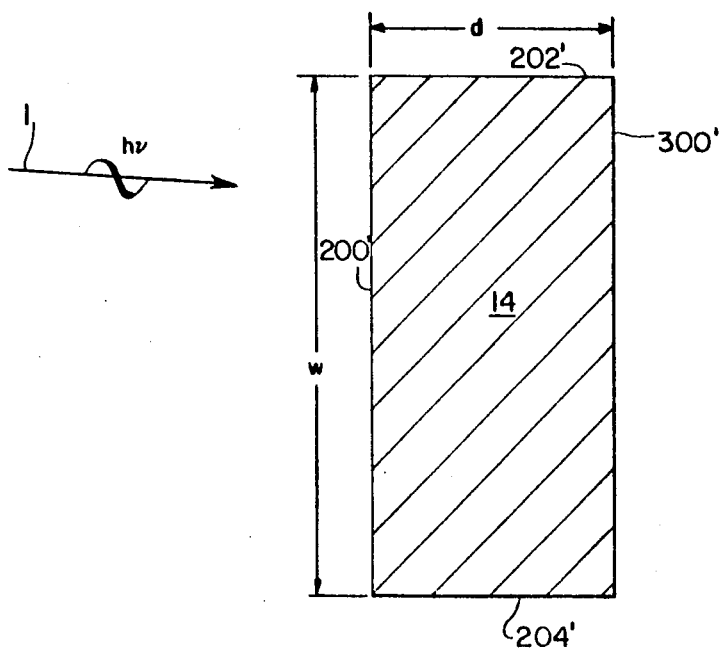
FIG. 14 is a cross-sectional view of a thin-film lens prepared according to the present invention.
Figure 15A:
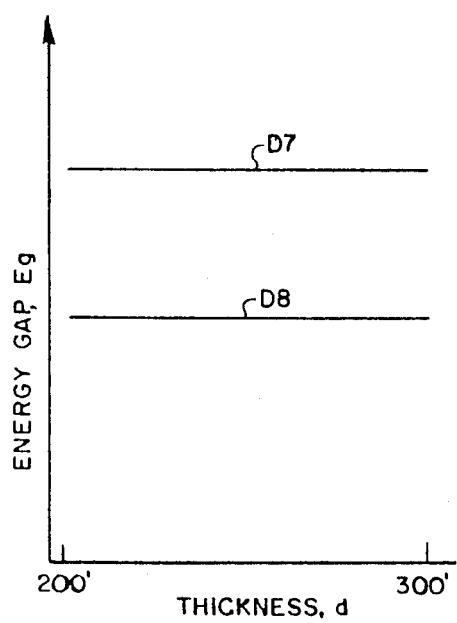
FIG. 15A is an orthogonal graph illustrating the variation in the energy gap as a function of the thickness of the film for two embodiments of the thin-film lens shown in FIG. 14.

FIG. 14 is a cross-section of a back illuminated semiconductor monocrystalline or polycrystalline layer 14 grown according to the modification of the graded gap process upon an unequally heated substrate. If deposited upon a substrate in which the same unequal temperature profile is maintained during growth, the layer 14 will be an optically flat film with a constant energy gap, $E_g$, along any line extending through its thickness (e.g., curves D7, D8 in FIG. 15A) but with a varying energy gap along its width (e.g., curves W7, W8 of FIG. 15B). If prepared using the center-of-substrate heating apparatus of FIG. 12A, a layer 14 grown from a $Pb_{1-x}Cd_xS$ alloy for example, will exhibit a cadmium-sulfide mole fraction varying radially along its width (i.e., between surfaces 202', 204') from a highest value at the center (i.e., midway between surfaces 202', 204' on any plane parallel to surfaces 200', 300') to a lowest value at the edges 202', 204'. Curve W7 is an example of the profile of the energy gap, and proportionately, the cadmium-chalcogenide mole fraction, of the layer 14 grown upon a centrally heated substrate. Concomitantly, as the refractive indices of pure CdS and pure PbS are generally accepted as 2.7 and 4.1 respectively in the infrared region, at 300° Kelvin, the refractive index of the layer varies radially along its width from a lowest value at its center where the CdS mole fraction is highest, to a highest value at the circumference where the PbS mole fraction is highest. As viewed by light 1 incident upon face 200', it is irrelevant whether layer 14 has a higher index of refraction or is thicker at its center, as in both instances, layer 14 acts upon incident light 1 (i.e., light having a wavelength greater than that wavelength corresponding to fundamental absorption edge of layer 14 at the point of incidence) in the same manner as a double concave lens.

Conversely, a double convex thin-film lens of the type shown in FIG. 14 may be prepared using the circumferential substrate heating apparatus shown in FIG. 13A. The energy gap along a radial parallel to surfaces 202', 204' would, as indicated by curve W8, vary from a lowest value at the center of layer 14 to a highest value at the edges 202', 204'. The index of refraction would vary inversely from a highest value at the center where the PbS mole fraction is highest to a lowest value at the circumference where the CdS mole fraction is highest.

Figure 15B:
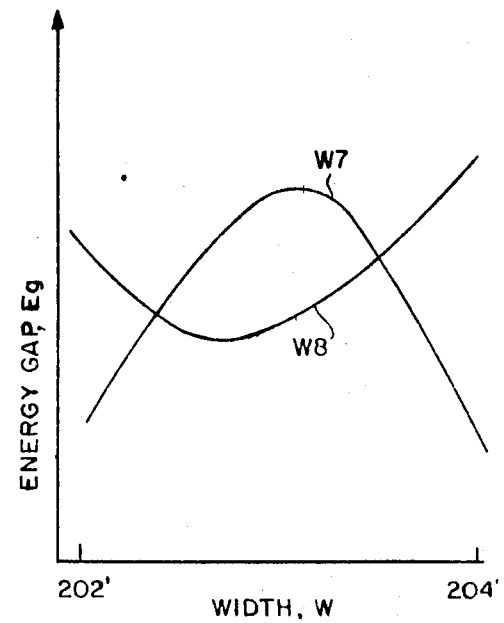
FIG. 15B is an orthogonal graph illustrating the variation in the energy gap as a function of the width of the film for the two embodiments represented by the curves of FIG. 15A.

Although the substrates 12 are shown in FIGS. 12A and 13A centered with respect to the heater elements 40, 40' respectively, it is easy to eccentrically position the substrate with respect to the axis of the heater element to prepare a semiconductor having an asymmetrically graded energy gap along its width. The curve W8 of FIG. 15B is an example of an asymmetrically graded energy gap. Various combinations of convergent and divergent thin-film lenses may be prepared by alternately heating the center and then the circumference of a substrate using a combination of the substrate heaters shown in FIGS. 12A and 13A. In addition, the energy gap profile of a layer grown upon an unequally heated substrate may be varied across the thickness as well as across the width of the layer by changing the amount of heat provided by the heater element during growth. Furthermore, by incorporating either the central or peripheral substrate heater with a uniform substrate heater 40, and independently controlling the heat delivered by each during the growth of the layer 14, it is possible to prepare thin film lenses that are asymmetric (e.g., planoconvex, concavo-convex, plano-concave, or convexo-concave) as well as symmetric with respect to the thickness of the film.

What is claimed, and desired to be secured by Letters Patent of the United States, is:

1. A lens comprising:
   a layer geometrically described by the orthogonal dimensions of thickness and width, the layer being prepared from a lead alloy having a cadmium-chalcogenide mole fraction, the cadmium-chalcogenide mole fraction of the layer depending upon at least one of the orthogonal dimensions.
2. The lens set forth in claim 1 wherein the mole fraction of the layer varies along the thickness of the layer.
3. The lens set forth in claim 2 wherein the mole fraction of the layer varies uniformly.
4. The lens set forth in claim 2 wherein the mole fraction of the layer varies abruptly.
5. The lens set forth in claim 2 wherein one or more abrupt variations in the mole fraction of the layer occur along its thickness, each of the variations defining a junction between adjoining parallel planar regions of constant mole fractions.
6. The lens set forth in claim 5 wherein one of the one or more abrupt variations comprises a region having a greater mole fraction disposed between incident radiation and an adjoining region.
7. The lens set forth in claim 1 wherein the mole fraction of the layer varies along the width of the layer.
8. The lens set forth in claim 7 wherein the mole fraction of the layer varies uniformly.
9. The lens set forth in claim 8 wherein the layer comprises a diverging lens
10. The lens set forth in claim 9 wherein the lens comprises a double concave lens.
11. The lens set forth in claim 9 wherein the lens comprises a plano-concave lens.
12. The lens set forth in claim 9 wherein the lens comprises a convexo-concave lens.
13. The lens set forth in claim 8 wherein the layer comprises a converging lens.
14. The lens set forth in claim 13 wherein the lens comprises a double convex lens.
15. The lens set forth in claim 13 wherein the lens comprises a plano-convex lens.
16. The lens set forth in claim 13 wherein the lens comprises a concavo-convex lens.
17. A semiconductor device prepared from a lead-cadmium chalcogenide alloy having a first composition, an epitaxial film having a second composition within a range including the first composition deposited upon an insulating substrate in a vacuum of at least $10^{-4}$Torr, according to a process comprising the steps of:
    heating the substrate to a temperature that is a function of the second composition and greater than 400° C.;
    maintaining a source of the alloy at a temperature greater than its sublimation temperature; and
    exposing the substrate to the source until the epitaxial film is deposited on the substrate, the mole fraction of cadmium-chalcogenide in said film varying between zero and six hundredths.
18. A semiconductor device, comprising:
    an epitaxial layer prepared from a source of a lead-cadmium chalcogenide alloy, the source having a first cadmium-chalcogenide mole fraction, the epitaxial layer having a second cadmium-chalcogenide mole fraction;
    the epitaxial layer having been deposited upon a surface of an insulating substrate in a vacuum of at least $10^{-4}$Torr;
    the source having been maintained at a temperature greater than the sublimation temperature of the alloy;
    the surface of the substrate having been maintained while the epitaxial layer was deposited, at an elevated temperature or a sequence of elevated temperatures indirectly proportional to the second cadmium chalcogenide mole fraction and greater than 350° C.; and
    the substrate having been exposed to the source while maintained at the elevated temperature or a sequence of elevated temperatures.
19. The device set forth in claim 18 wherein the elevated temperature or sequence of elevated temperatures is greater than 400° C. and the second cadmium-chalcogenide mole fraction exceeds the first cadium-chalcogenide mole fraction.
20. The device set forth in claim 18 wherein the surface is uniformly maintained at a single temperature.
21. The device set forth in claim 18 wherein the sequence of elevated temperatures comprises a uniform variation in temperature while the epitaxial layer is being deposited.
22. The device set forth in claim 18 wherein the sequence of elevated temperatures comprises an abrupt variation in temperature while the epitaxial layer is being deposited.

23. The device set forth in claim 18 wherein the sequence of elevated temperatures comprises an abrupt variation in temperature while the epitaxial layer is being deposited and the substrate is being shielded from the source.

24. The device set forth in claim 18 wherein the epitaxial layer is described by a plurality of orthogonal dimensions and the value of the second cadimum-chalcogenide mole fraction varies along at least one of the orthogonal dimensions.

25. The device set forth in claim 24 wherein the one of the orthogonal dimensions is the thickness of the epitaxial layer.

26. The device set forth in claim 24 wherein the one of the orthogonal dimensions is the width of the epitaxial layer.

27. The device set forth in claim 18, wherein the epitaxial layer has a pair of opposed and spaced apart surfaces, and variance in value of the second cadmium-chalcogenide mole fraction along an imaginary straight line passing between the pair of surfaces defines a parabola.

28. The device set forth in claim 18, wherein the epitaxial layer has a center spaced between opposite edges, and variance in value of the second cadmium-chalcogenide mole fraction along an imaginary straight line running between the opposite edges and passing through the center in a plane parallel to the width describes a parabola.

29. A semiconductor device prepared from a lead-cadmium chalcogenide alloy having a first cadmium-chalcogenide mole fraction, an epitaxial layer having a second cadmium-chalcogenide mole fraction within a range including the first mole fraction deposited upon an insulating crystalline substrate in a vacuum of at least $10^{-4}$Torr, according to a process comprising the steps of:

maintaining a source of the alloy at a temperature greater than its sublimation temperature, said alloy having mole fraction range limits of zero and fifteen percent;

maintaining the substrate at a temperature within a range of 400° C. to 513° C.;

exposing the substrate to the source; and varying the second mole fraction by changing the temperature of the substrate.

* * * * *